(12) United States Patent
Kyung (10) Patent No.: US 6,813,198 B2
(45) Date of Patent: Nov. 2, 2004

(54) SEMICONDUCTOR MEMORY DEVICE AND METHOD OF REPAIRING THE SAME

(75) Inventor: Kye-Hyun Kyung, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 14 days.

(21) Appl. No.: 10/160,127

(22) Filed: Jun. 4, 2002

(65) Prior Publication Data

US 2002/0196684 A1 Dec. 26, 2002

(30) Foreign Application Priority Data

Jun. 4, 2001 (KR) ..................................... 2001-0031171

(51) Int. Cl.[7] ............................. G11C 29/00; G11C 7/00
(52) U.S. Cl. ................................. 365/200; 365/230.03
(58) Field of Search ............................. 365/200, 230.03

(56) References Cited

U.S. PATENT DOCUMENTS

| | | | | |
|---|---|---|---|---|
| 5,594,732 A | * | 1/1997 | Bell et al. ................... 711/143 |
| 5,918,242 A | * | 6/1999 | Sarma et al. ................... 711/5 |
| 6,052,318 A | * | 4/2000 | Kirihata et al. ............. 365/200 |
| 6,118,710 A | * | 9/2000 | Tsuji ........................... 365/200 |
| 6,367,030 B1 | * | 4/2002 | Yamauchi ....................... 714/7 |
| 6,469,932 B2 | * | 10/2002 | Roohparvar et al. ... 365/185.09 |

* cited by examiner

Primary Examiner—VanThu Nguyen
(74) Attorney, Agent, or Firm—Harness, Dickey & Pierce, P.L.C.

(57) ABSTRACT

The semiconductor memory device includes a selecting circuit for selectively changing the mapping of address information to rows of normal and redundant memory cells. By controlling the operation of the selecting circuit, a row of normal memory cells including a defective memory cell can be replaced with an available row of non-defective redundant memory cells even if the row of redundant memory cells is not usually associated with the row of normal memory cells being replaced.

24 Claims, 11 Drawing Sheets

SEMICONDUCTOR MEMORY DEVICE AND METHOD OF REPAIRING THE SAME

BACKGROUND OF THE INVENTION

1. Field of the Invention

The present invention relates to a semiconductor memory device, and more particularly, to a semiconductor memory device which can replace a defective memory cell with a redundant memory cell and a method of repairing the same.

2. Description of Related Art

A semiconductor memory device includes normal memory cells and redundant memory cells. When defects occur in the normal memory cells, defective memory cells are replaced with redundant memory cells in order to repair the semiconductor memory device.

However, when defective word lines are replaced with redundant word lines, only the redundant word line corresponding to the defective word lines can be used to replace the defective word lines. Therefore, when redundant memory cells connected to the redundant word lines having a decoding signal identical to the defective word lines are defective, the defective memory cells cannot be repaired.

Also, when the defective word lines are more in number than the redundant word lines corresponding to the defective word lines, the conventional semiconductor memory device cannot be repaired. Further, when the redundant word lines are associated with different decoding signals from the defective word lines, the defective word lines cannot be replaced with these redundant word lines even if these redundant word lines are not in use, thereby lowering a repairing efficiency.

SUMMARY OF THE INVENTION

The semiconductor integrated circuit according to the present invention includes a selecting circuit that selectively maps address information to rows of normal and redundant memory cells. By controlling the selecting circuit, the address information normally supplied to a row of normal or redundant row of memory cells can be supplied to a different row of normal or redundant memory cells. In one embodiment, this is accomplished by changing the parallel arrangement of row address information supplied to row decoders addressing the memory array.

By controlling the operation of the selecting circuit, a control circuit can cause a row of redundant memory cells that do not correspond to a row of normal memory cells (i.e., are associated with different decoding signals) to replace the row of normal memory cells. As a result, even if two rows of normal memory cells associated with the same decoding signal include a defective memory cell, both of the rows of memory cells can be replaced with rows of redundant memory cells. Additionally, even when a row of normal memory cells and the corresponding row of redundant memory cells both include a defective memory cell, the row of normal memory cells can be replaced with a row of redundant memory cells.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION OF PREFFERED EMBODIMENTS

Reference will now be made in detail to preferred embodiments of the present invention, at least one example of which is illustrated in the accompanying drawings.

Figure 1:
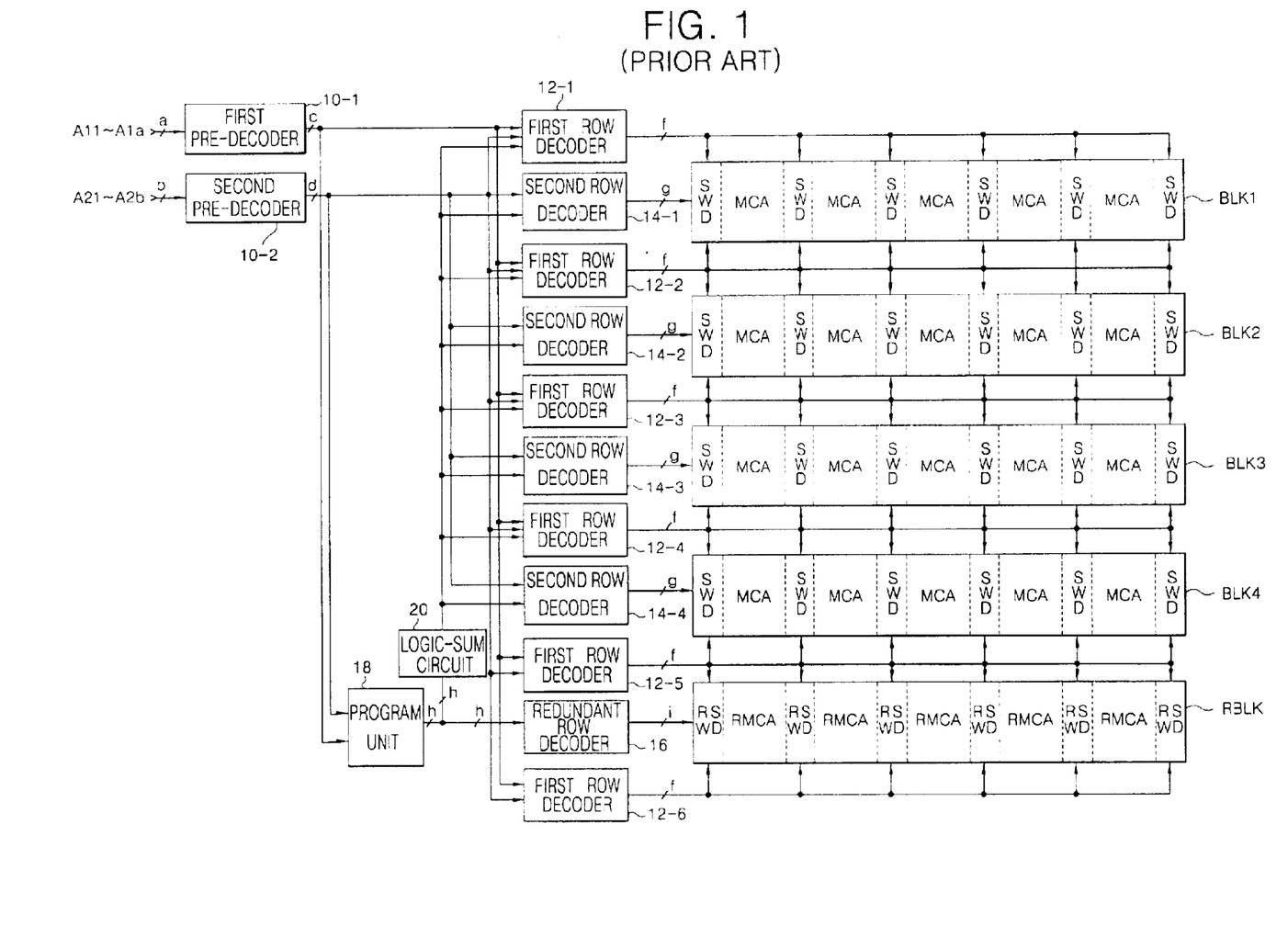
FIG. 1 is a block diagram illustrating a conventional semiconductor memory device.

Turning now to the drawings, FIG. 1 is a block diagram illustrating a prior art semiconductor memory device. The semiconductor memory device of FIG. 1 includes memory cell array blocks BLK1 to BLK4, a redundant memory cell array block RBLK, first and second pre-decoders 10-1 and 10-2, first row decoders 12-1 to 12-6, second row decoders 14-1 to 14-4, a redundant row decoder 16, a program unit 18, and a logic-sum circuit 20.

Each of the memory cell array blocks BLK1 to BLK4 includes sub memory cell array blocks MCA and sub word line drivers SWD, which are arranged in turn. The redundant memory cell array block RBLK includes redundant sub memory cell array blocks RMCA and redundant sub word line drivers RSWD, which are arranged in turn.

The first pre-decoder 10-1 pre-decodes a-bit lower row addresses A11 to A1a to generate a number, c, of first pre-decoding signals. The second pre-decoder 10-2 pre-decodes b-bit upper row addresses A21 to A2b to generate a number, d, of second pre-decoding signals. The first pre-decoding signals are classified into upper first pre-decoding signals and lower first pre-decoding signals. Each of the first row decoders 12-1, 12-3 and 12-5 pre-decodes c/2 of the upper first pre-decoding signals and e of the second pre-decoding signals associated with a block selection so as to generate f upper first decoding signals. Each of the first row decoders 12-2, 12-4 and 12-6 pre-decodes c/2 of the lower first pre-decoding signals and e of the second pre-decoding signals associated with a block selection so as to generate f lower first decoding signals.

Each of the first row decoders 12-2 to 12-5 is shared by the adjacent memory cell array block, and is selected when the corresponding memory cell array block is selected in order to perform a decoding operation. The second row decoders 14-1 to 14-4 decode the d second pre-decoding signals to respectively generate g word line enable signals in order to select one normal word line.

The program unit 18 programs row address information of the defective memory cells using fuses, and generates h redundant enable signals when the row address information inputted during a read operation or a write operation is identical to the programmed row address information.

The logic-sum circuit 20 logic-sums the h redundant enable signals to disable an operation of the first row decoders 12-1 to 12-4 and the second row decoders 14-1 to 14-4. The redundant row decoder 16 decodes the h redundant enable signals to generate i redundant word line enable signals in order to select one redundant word line.

The semiconductor memory device of FIG. 1 is configured to include one redundant memory cell array block RBLK with respect to the whole memory cell array blocks BLK1 to BLK4. However, the semiconductor memory device of FIG. 1 can be configured such that each of the memory cell array blocks BLK1 to BLK4 includes one redundant memory cell array block RBLK.

Figure 2:
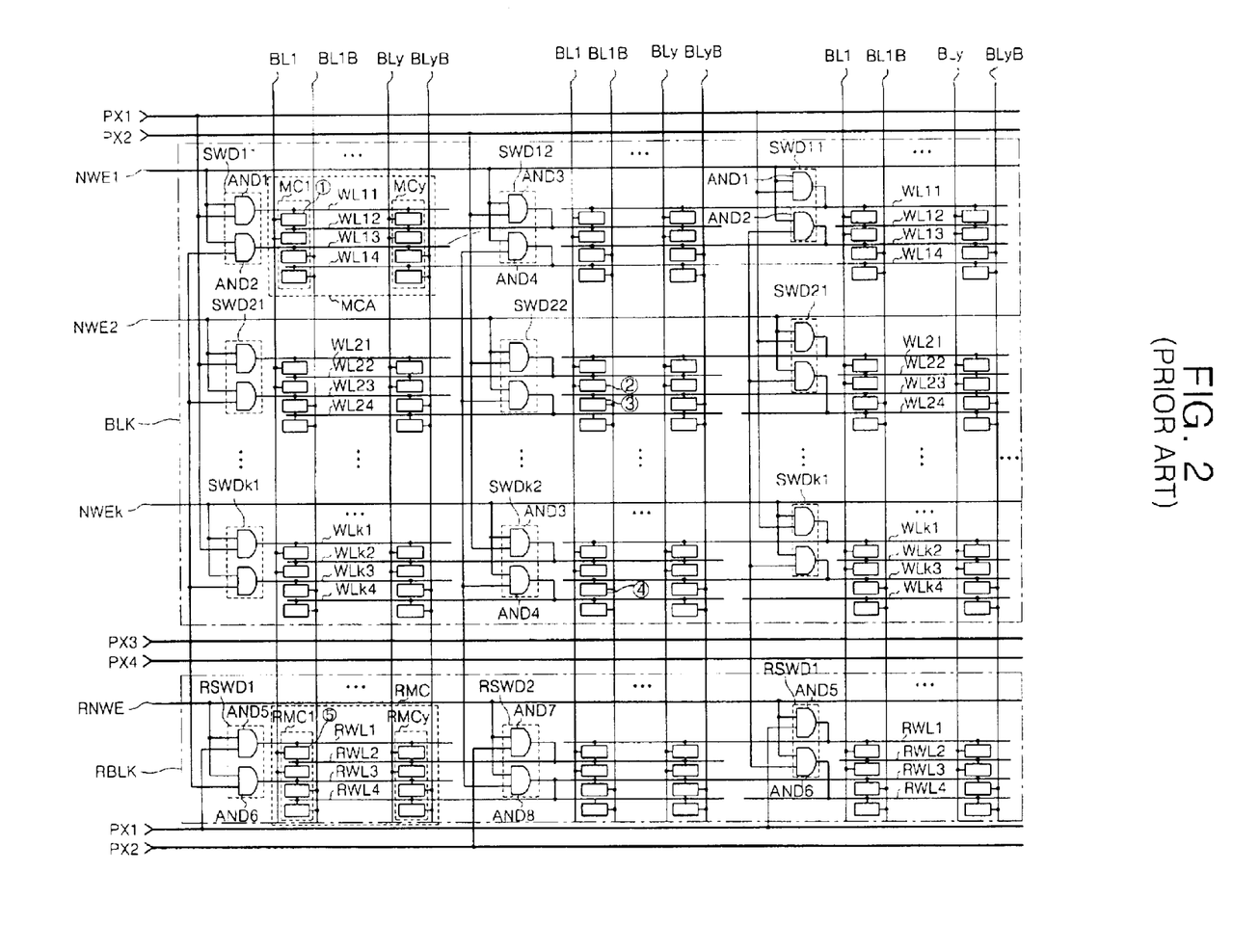
FIG. 2 is a block diagram illustrating a memory cell array block BLK4 and a redundant memory cell array block RBLK of FIG. 1.

FIG. 2 is a block diagram illustrating a memory cell array block BLK4 and the redundant memory cell array block RBLK of FIG. 1. The other memory cell array blocks BLK1-BLK3 have the same structure as the memory cell array block BLK4, and therefore, a description thereof will not be repeated for the sake of brevity.

Referring to FIG. 2, upper first decoding signals PX1 and PX2 are generated from each of the first row decoders 12-1, 12-3 and 12-5, and lower first decoding signals PX3 and PX4 are generated from each of the first row decoders 12-2, 12-4 and 12-6. The redundant memory cell array block RBLK includes one redundant word line RNWE, and the memory cell array block BLK includes K word lines NWE1–NWEK. As further shown, each word line NWEq defines a row of alternating first sub word line driver SWDq1, sub memory cell array block MCA, second sub word line driver SWDq2 and sub memory cell array block MCA, where q=1 to k. Similarly, the redundant word line RNWE defines a row of alternating first redundant sub word line drivers RSWD1, redundant memory cell array block RMC, second redundant sub word line driver RSWD2 and redundant memory cell array block RMC.

Each sub memory cell array block MCA includes (i) an array of first memory cells MC1, which are connected to first bit and bit-bar lines BL1 and BL1B and to first-fourth sub word lines WLq1–WLq4, and (ii) an array of second memory cells MCy, which are connected to yth bit and bit-bar lines BLy to BLyB and to the first-fourth sub word lines WLq1–WLq4. Similarly, the redundant sub memory cell array block RMCA includes (i) an array of first redundant memory cells RMC1, which are connected to the first bit and bit-bar lines BL1 and BL1B and to first-fourth redundant sub word lines RWL1–RWL4, and (ii) an array of second redundant memory cells RMCy, which are connected to the yth bit and bit-bar lines BLy to BLyB and to the first-fourth redundant sub word lines RWL1–RWL4. It should be noted that while the first to yth bit and bit-bar lines BL1, BL1B to BLy and BLyB in each column have the same reference numeral to simplify the description, the bit and bit-bar lines in each column are different.

The sub word line drivers SWDq1 each include AND gates AND1 and AND2. The AND gate AND1 ANDs the first decoding signal PX1 and a signal transferred to an associated one of word lines NWE1 to NWEk in order to select sub word lines WL11 to WLk4. The AND gate AND2 ANDs the first decoding signal PX3 and a signal transferred to an associated one of the word lines NWE1 to NWEk in order to select an associated one of the third sub word lines WL13 to WLk3.

The sub word line drivers SWDq2 each includes AND gates AND3 and AND4. Each of the AND gates AND3 ANDs the first decoding signal PX2 and a signal transferred to an associated one of word lines NWE1 to NWEk in order to select an associated one of the third sub word lines WL12 to WLk2. Each of the AND gates AND4 ANDs the first decoding signal PX4 and a signal transferred to an associated one of the word lines NWE1 to NWEk in order to select an associated one of the fourth sub word lines WL14 to WLk4.

Each of the first redundant sub word line drivers RSWD1 each include AND gates AND5 and AND6. Each of the AND gates AND5 ANDs the first decoding signal PX1 and a signal transferred to the redundant word line RNWE in order to select the first redundant sub word lines RWL1. Each of the AND gates AND6 ANDs the first decoding signal PX3 and a signal transferred to the redundant word line RNWE in order to select the third redundant sub word lines RWL3.

The second redundant sub word line driver RSWD2 each include AND gates AND7 and AND8. The AND gate AND7 ANDs the first decoding signal PX2 and a signal transferred to the redundant word line RNWE in order to select the second redundant sub word line RWL2. The AND gate AND8 ANDs the first decoding signal PX4 and a signal transferred to the redundant word line RNWE in order to select the fourth redundant sub word line RWL4.

An operation of the semiconductor memory device of FIG. 2 is described below.

When a defect occurs in the memory cells of the normal memory cell array block BLK, row address information of the defective normal memory cells is programmed by blowing the fuses (not shown) of the program unit 18. The program unit 18 generates the redundant word line enable signal RWEN when the row address information output from the first and second pre-decoders 10-1 and 10-2 is identical to the programmed row address information. In response to the redundant word line enable signal RWEN, the redundant word line RNWE is enabled, and an operation of the first row decoder 12-1 to 12-4 and the second row decoders 14-1 to 14-4 is disabled. Consequently, the defective normal memory cells are not accessed, and the redundant memory cells connected to the redundant word line RNWE are accessed.

For example, assume that defects occur in the memory cells ①, ② and ③ and the row address information of the defective normal memory cells ①, ② and –③ is pro When the row address information input during a read operation or a write operation is identical to the row address information programmed in the program unit 18, the redundant word line enable signal RWEN is generated. Hence, the defective normal word line NWE1 is not selected, and the redundant word line RNWE is selected. The AND gate AND5 selects the first redundant sub word line RWL1 by ANDing a signal transferred to the redundant word line RNWE and the first decoding signal PX1. In this case, the defective normal word line NWE1 is replaced with the first redundant sub word line RWL1.

In the same way, when the externally input row address information is identical to the programmed row address information of the defective memory cells ② and ③, the second sub word line WL22 is replaced with the second redundant word line RWL2, and the third sub word line WL23 is replaced with the third redundant word line RWL3.

The semiconductor memory device of FIG. 2 can repair the defective memory cells when the defects occur in the sub word lines corresponding to each of four different first decoding signals.

However, a memory cell cannot be repaired when one redundant sub word line is provided but defects occur in memory cells connected to at least two different sub word lines associated with the same redundant sub word line (e.g., sub word lines WL11 and WL21). That is, a memory cell cannot be repaired when the number of the defective sub word lines corresponding to the same first decoding signal is more than the number of the redundant sub word lines also corresponding to the same first decoding signal.

Also, a memory cell cannot be repaired when defects occur in the memory cells connected to one of the sub word lines (e.g., the first sub word line WL11) and defects occur in the redundant memory cells connected to the associated redundant sub word line (e.g., first redundant sub word line RWL1). That is, the memory cell cannot be repaired when defects occur in both the sub word line and the redundant sub word line which correspond to the same first decoding signal. The conventional semiconductor memory device can perform a repairing operation with respect to each of the sub word lines by programming the row address information. However, since the first decoding signal is fixed, the defective word line is replaced with only the redundant sub word line having the same first decoding signal, thereby lowering a repairing efficiency.

Figure 3:
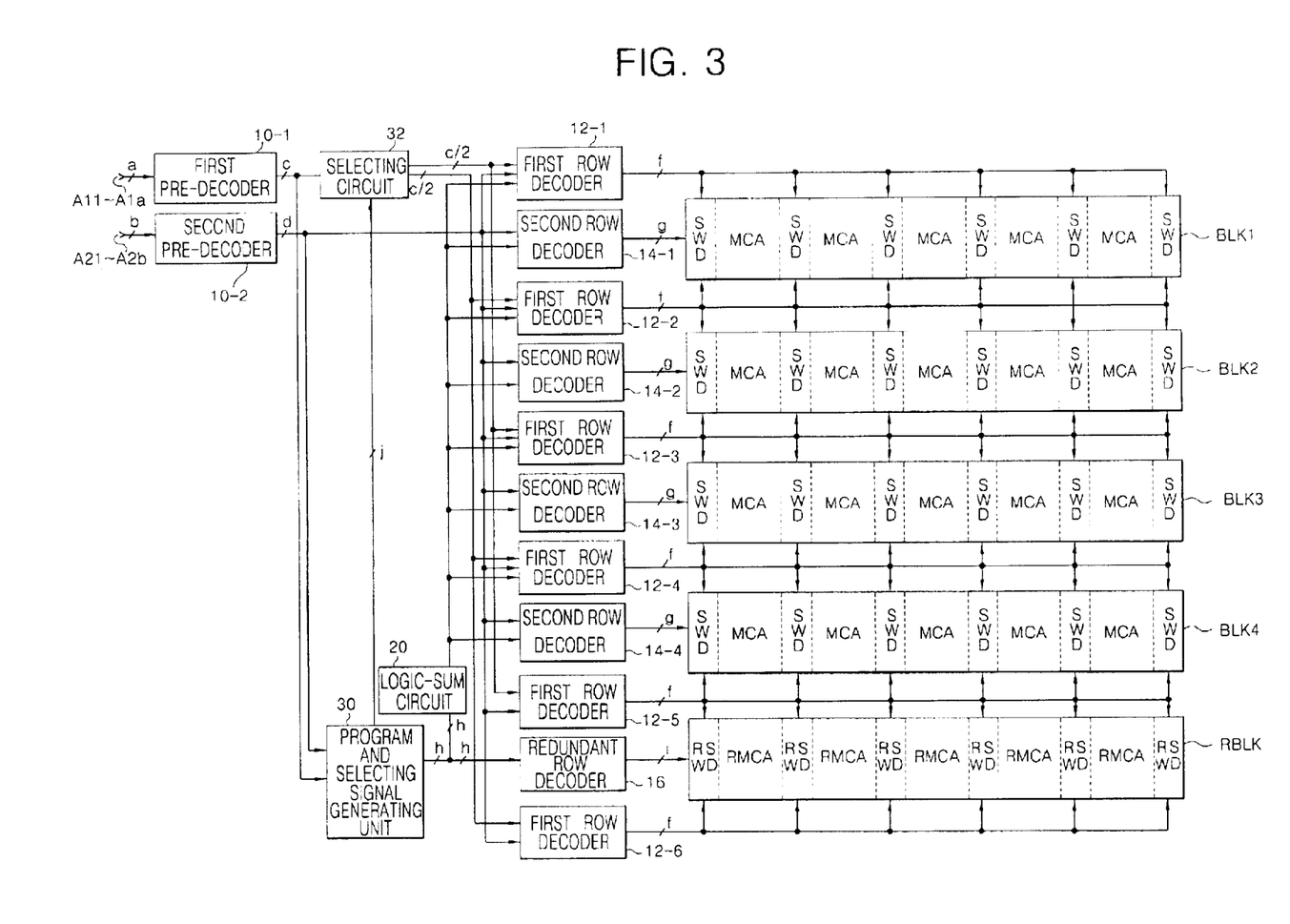
FIG. 3 is a block diagram illustrating a semiconductor memory device according to the present invention.

FIG. 3 is a block diagram illustrating a semiconductor memory device according to the present invention. The semiconductor memory device of FIG. 3 has a configuration similar to that of FIG. 1, and like reference numerals designate like components, the description of which will not be repeated for the sake of brevity. The program unit 18 of FIG. 1 has been replaced by a program and selecting signal generating unit 30, and a selecting circuit 32 is added between the first pre-decoder 10-1 and the first and second row decoders 12-1 to 12-6 and 14-1 to 14-4.

The program and selecting signal generating signal 30 programs row address information of the defective normal memory cells by using fuses, and generates h redundant enable signals when the row address information input externally during a read operation or a write operation is identical to the programmed row address information. The selecting circuit 32 also generates j selecting signals.

The selecting circuit 32 changes an association of or mapping of the c first pre-decoding signals to particular first decoding signals in response to the j selecting signals and outputs the remapped first-predecoding signals. And, c/2 of the first predecoding signals are transferred to the first row decoders 12-1, 12-3 and 12-5, and the remaining c/2 first pre-decoding signals are transferred to the first row decoders 12-2, 12-4 and 12-6.

The semiconductor memory device of FIG. 3 maps the first pre-decoding signals with particular first decoding signals using the selecting circuit 32. Accordingly, the semiconductor memory can replace a sub word line connected to defective normal memory cells with a redundant sub word line corresponding to a different first pre-decoding signal even though defects occur in the redundant memory cells connected to the redundant sub word line corresponding to the same first pre-decoding signal as the sub word line connected to the defective normal memory cells.

Figure 4:
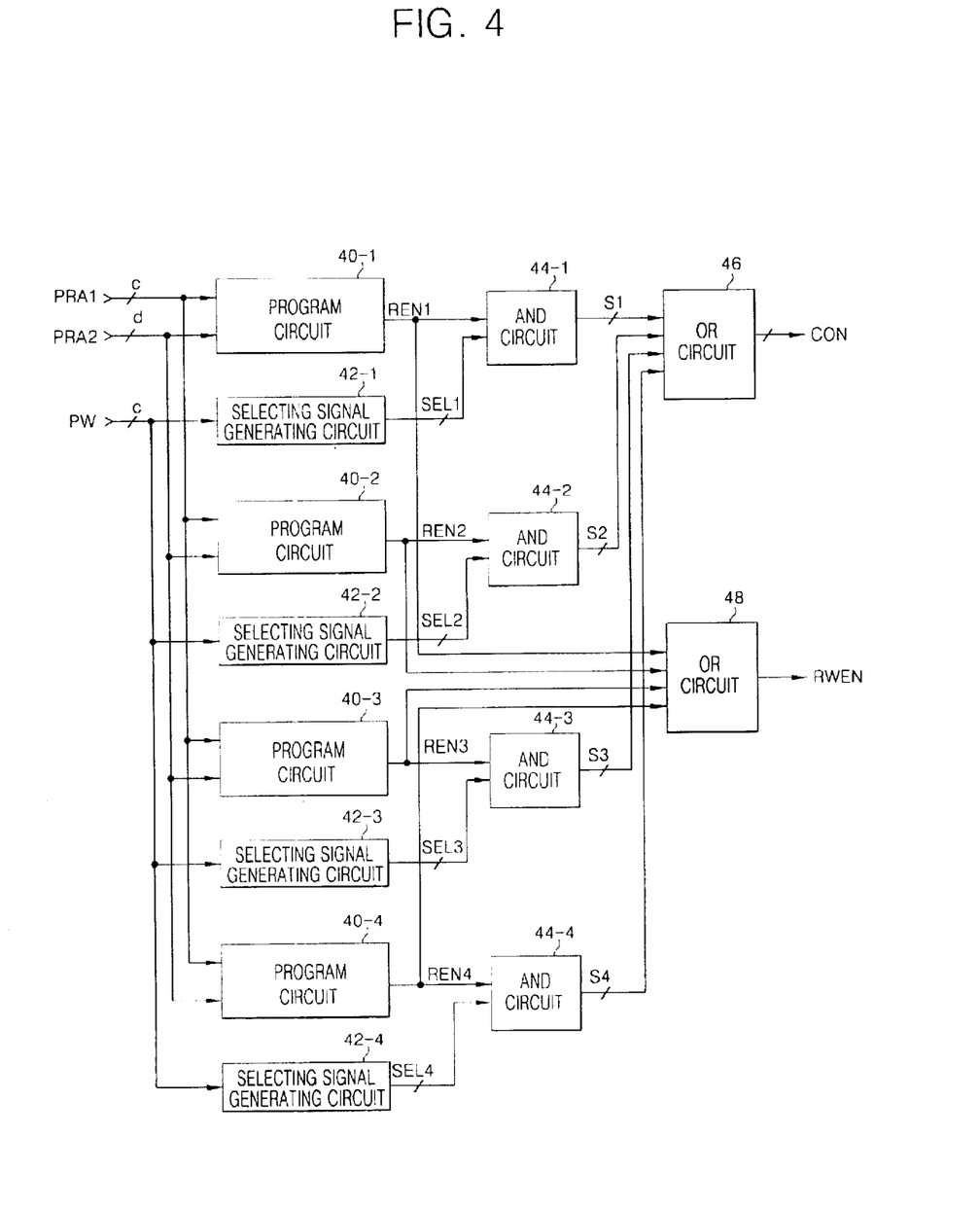
FIG. 4 is a block diagram illustrating a program and selecting signal generating unit of the semiconductor memory device of FIG. 3.

FIG. 4 is a block diagram illustrating the program and selecting signal generating unit 30 of the semiconductor memory device of FIG. 3. The program and selecting signal generating unit 30 of FIG. 4A includes program circuits 40-1 to 40-4, selecting signal generating circuits 42-1 to 42-4, AND circuits 44-1 to 44-4, and OR circuits 46 and 48.

FIG. 4 shows a circuit configuration to generate the redundant enable signal RWEN that drives the redundant word line RNWE of the redundant memory cell array block RBLK. In FIG. 4, "PRA1" and "PRA2" denote the first and second pre-decoding signals, respectively, and "PW" denotes a power-up signal.

Each of the program circuits 40-1 to 40-4 have row address information of the defective normal memory cells programmed therein by having fuses therein blown, and generates the redundant enable signal RWEN when row address information input during a read operation or a write operation is identical to the programmed row address information. Because the structure and operation of these program circuits 40 is the same as that of the programming unit 18 of the prior art, a detailed description of the program circuits 40 will not be provided for the sake of brevity. When the redundant enable signal RWEN is generated, an operation of the first row decoders 12-1 to 12-4 and the second row decoders 14-1 to 14-4 is disabled.

Each of the selecting signal generating circuits 42-1 to 42-4 is also programmed by having fuses blown, and generates first selecting signals SEL1 to SEL4 in response to the power-up signal PW. The power-up signal PW increases according to a level variation of a power voltage VDD when the power voltage VDD is applied, and then drops to a logic "low" level when the power-up signal PW reaches a predetermined level after a predetermined time period.

Each of the AND circuits 44-1 to 44-4 generates second selecting signals S1 to S4 by respectively ANDing one of the redundant enable signals REN1 to REN4 and an associated one of the first selecting signals SEL1 to SEL4.

The OR circuit 46 generates a control signal CON by ORing output signals of the AND circuits 44-1 to 44-4. The OR circuit 48 generates a redundant word line enable signal RWEN by ORing the redundant enable signals REN1 to REN4.

The program and selecting signal generating unit of FIG. 4 is configured, in one embodiment, such that each of the program circuits 40-1 to 40-4 includes each of the selecting signal generating circuits 42-1 to 42-4. The program and selecting signal generating unit can also be configured such that parts of the program circuits 40-1 to 40-4 include the selecting signal generating circuits 42-1 to 42-4 but other parts of the program circuits 40-1 to 40-4 do not include the selecting signal generating circuits 42-1 to 42-4.

Figure 5:
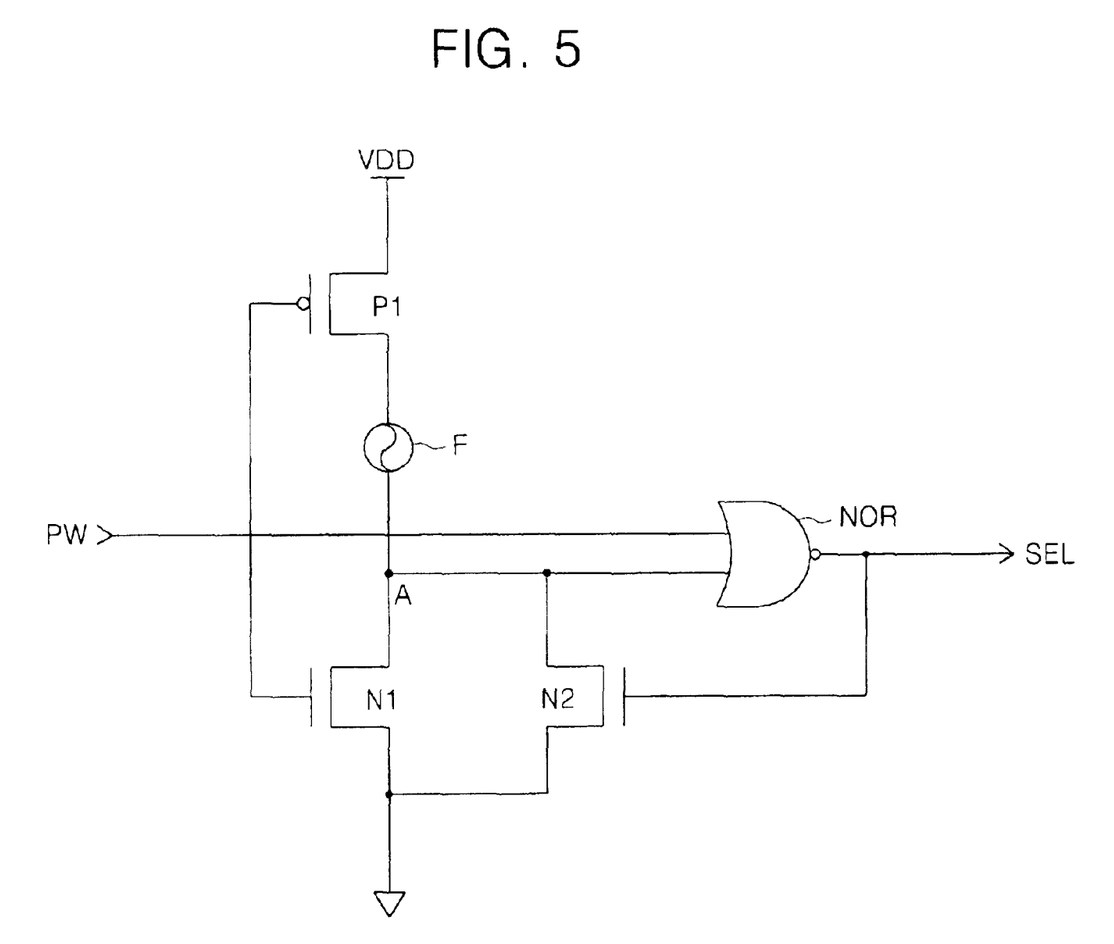
FIG. 5 is a circuit diagram illustrating a selecting signal generating circuit of FIG. 4.

FIG. 5 is a circuit diagram illustrating one embodiment of a selecting signal generating circuit 42 of FIG. 4. The selecting signal generating circuit 40 of FIG. 5 includes a PMOS transistor P1, NMOS transistors N1 and N2, a fuse F, and a NOR gate NOR.

When a fuse F is blown and the power voltage VDD is applied, the NMOS transistor N1 is turned on in response to the power-up signal PW at the beginning, and a signal having a logic "low" level is generated to a node A. Thereafter, when the power-up signal PW is transited to a logic "low" level, the NOR gate NOR generates a first selecting signal SEL having a logic "high" level. That is, when the fuse F is blown and the power-up signal PW is applied, the first selecting signal SEL is transited from a logic "low" level to a logic "high" level.

Thereafter, the NMOS transistor N2 is turned on in response to the first selecting signal SEL having a logic "high" level, and the node A is maintained to a logic "low" level. Hence, while the power-up signal PW maintains a logic "low" level, the first selecting signal SEL maintains a logic "high" level. That is, when the fuse F is blown, the first selecting signal SEL having a logic "high" level is generated.

When the fuse F is not blown and the power voltage VDD is applied, the NMOS transistor N1 is turned on in response to the power-up signal PW at the beginning, and a signal having a logic "low" level is generated to the node A. Thereafter, when the power-up signal PW is transited to a logic "low" level, the PMOS transistor P1 is turned on, and a signal having a logic "high" level is generated to the node A.

The NOR gate NOR generates the first selecting signal SEL having a logic "low" level by NORing the power-up signal PW having a logic "low" level and a signal of the node A having a logic "high" level. While the power-up signal PW maintains a logic "low" level, the first selecting signal SEL maintains a logic "low" level. That is, when the fuse F is not blown, the first selecting signal SEL having a logic "low" level is generated.

Figure 6:
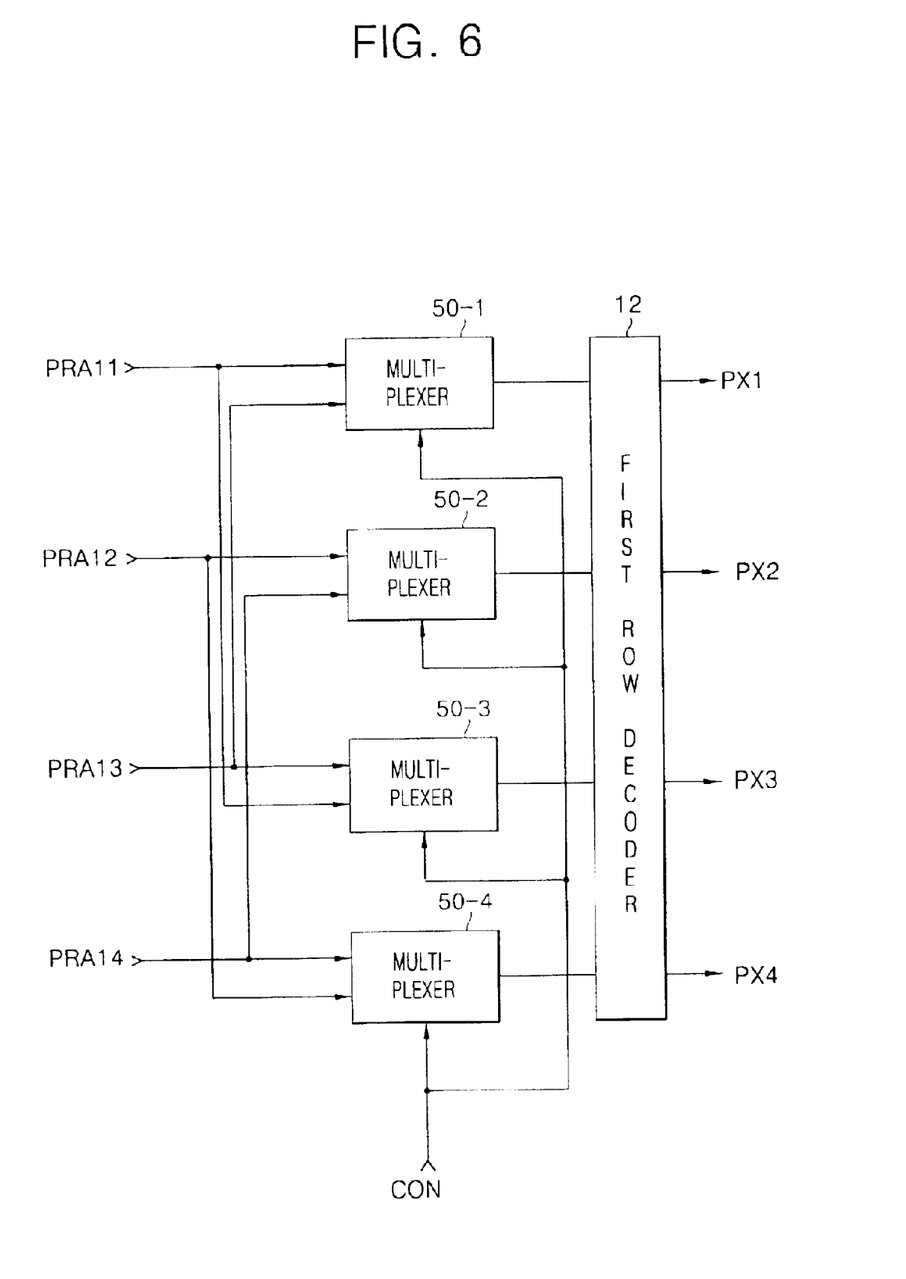
FIG. 6 is a block diagram illustrating one embodiment of a selecting circuit of FIG. 3.

FIG. 6 is a block diagram illustrating one embodiment of the selecting circuit 32 of FIG. 3. The selecting circuit 32 of FIG. 6 includes multiplexers 50-1 to 50-4 and receives first pre-decoding signals PRA11, PRA12, PRA13 and PRA14; wherein the first pre-decoding signal PRA11 normally addresses the sub word lines WLq1 of FIG. 2, the first pre-decoding signal PRA12 normally addresses the sub word lines WLq2, the first pre-decoding signal PRA13 normally addresses the sub word lines WLq3 and the first pre-decoding signal PRA14 normally addresses the sub word lines WLq4.

The multiplexers 50-1 to 50-4 selectively map the first pre-decoding signals PRA11, PRA12, PRA13, and PRA14 to the first decoding signals PX1 to PX4, respectively, in response to the control signal CON when the control signal is "0", respectively. The multiplexers 50-1 to 50-4 also selectively map the first predecoding signals PRA13, PRA14, PRA11, and PRA12 as the first decoding signals PX1 to PX4, respectively, in response to the control signal CON when the control signal is "1", respectively.

In other words, the selecting circuit of FIG. 6 outputs the first pre-decoding signals PRA11, PRA12, PRA13, and PRA14 "as is" in response to the control signal CON having a logic "low" level. This is the association that would exist if the selecting circuit 32 were not present. The selecting circuit of FIG. 6 maps the first predecoding signals PRA11 and PRA12 as the first decoding signals PX3 and PX4 and maps or associates the first pre-decoding signals PRA13 and PRA14 as the first decoding signals PX1 and PX2 in response to the control signal CON having a logic "high" level. Namely, the selecting circuit 32 can selectively change the parallel order of the first pre-decoding signals such that when the first row decoders 12 decode the first pre-decoding signals to produce the first decoding signals PX1–PX4, the first decoding signals PX1–PX4 can be generated from a different one of the first pre-decoding signals than if the selecting circuit 32 were absent. This has been logically illustrated in FIG. 6, and is described as such below.

When using the selecting circuit of FIG. 6, each of the selecting signal generating circuits 42-1 to 42-4 of FIG. 4 includes one circuit of FIG. 5 in order to generate the first selecting signals SEL1 to SEL4. The effect of mapping the first pre-decoding signals to the first decoding signals will be described in detail below with respect to another embodiment of the selecting circuit 32 illustrated in FIG. 7.

Figure 7:
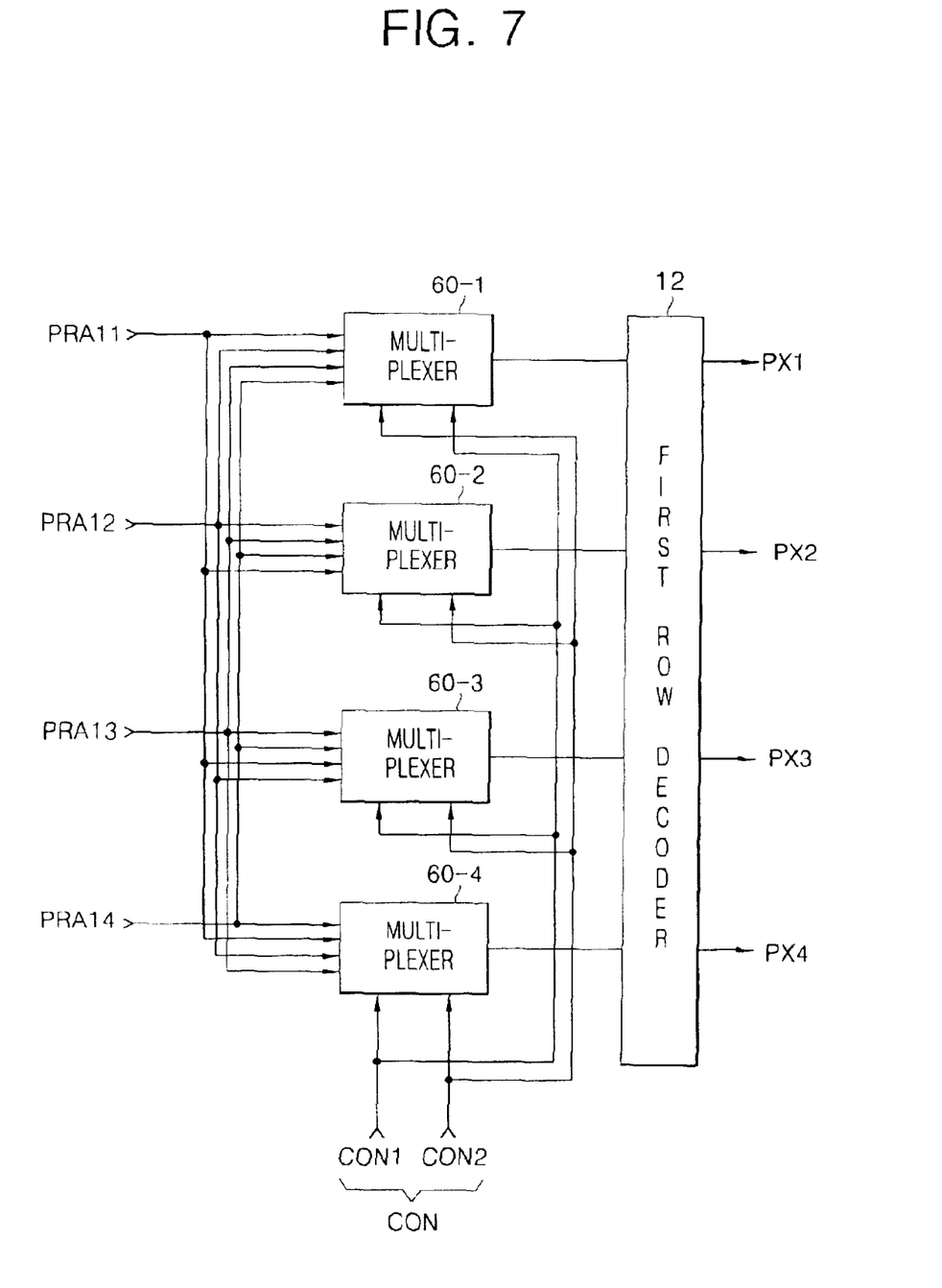
FIG. 7 is a block diagram illustrating another embodiment of a selecting circuit of FIG. 3.

FIG. 7 is a block diagram illustrating another embodiment of the selecting circuit 32 in FIG. 3. The selecting circuit 32 of FIG. 7 includes multiplexers 60-1 to 60-4. The multiplexers 60-1 to 60-4 map the first pre-decoding signals PRA11, PRA12, PRA13, and PRA14 as the first decoding signals PX1 to PX4, respectively, when the control signal CON (two bits in this embodiment wherein CON1 and CON2 represent each bit) is "00", the first pre-decoding signals PRA12, PRA13, PRA14, and PRA11 as the first decoding signals PX1 to PX4, respectively, when the control signal CON is "01", the first pre-decoding signals PRA13, PRA14, PRA11, and PRA12 as the first decoding signal, PX1 to PX4, respectively, when the control signal is "10", and the first pre-decoding signals PRA14, PRA11, PRA12, and PRA13 as the first decoding signal, PX1 to PX4, respectively, when the control signal is "11".

The selecting circuit of FIG. 7 changes an association of the first predecoding signals PRA11, PRA12, PRA13, and PRA14 with the first decoding signals PX1 to PX4 in response to a two bit control signal CON. To generate a two bit control signal CON, each of the selecting signal generating circuits 42-1 to 42-2 includes two selecting signal generating circuits such as shown in FIG. 5 such that two bit selection signals are generated. Accordingly, fuses are blown in these circuits to program the generation of the selection signals in the same manner described above with respect to FIGS. 4 and 5.

While the multiplexers 60-1 to 60-4 are configured to select one of the four first pre-decoding signals PRA11, PRA12, PRA13, and PRA14 in response to the two bit control signal CON, a configuration of the multiplexers 60-1 to 60-4 can be varied. For example, the multiplexers 60-1 to 60-4 can be configured to select one of the four pre-decoding signals PRA11, PRA12, PRA13, and PRA14 in response to a four bit control signal to generate the first decoding signals PX1 to PX4.

FIGS. 4 to 7 show circuit configurations to drive the redundant word line RWEN of the redundant memory cell array RBLK of FIG. 2. The repairing operation according to an embodiment of the present invention will now be described with reference to FIG. 3 assuming that the circuits of FIGS. 4, 5 and 7 are employed along with the circuit of FIG. 2 in the circuit of FIG. 3. Instead of describing each and every possible repair operation, a few examples are given from which each and every possible repair operation is readily apparent.

When defects occur in the normal memory cell ① and the redundant memory cell ⑤, which correspond to the same first decoding signal, the program circuit 40-1 of FIG. 4 is programmed with row address information of the defective normal memory cell, and the fuses of the selecting signal generating circuit 42-1 are blown to generate the selecting signal SEL1 that maps the address information (i.e., first pre-decoding signal) normally associated with the row including the defective normal memory cell to an available row of redundant memory cells that does not include any defective memory cells.

For example, assume the row of redundant memory cells associated with the redundant sub word line RWL2 does not include any defective memory cells and is available to replace a defective normal sub word line. Since the sub word line WL11 connected to the defective normal memory cell ① and the redundant sub word line RWL1 connected to the defective redundant memory cell ⑤ both correspond to the same first decoding signal, in order to replace the sub word line WL11 with the redundant sub word line RWL2, the selecting signal generating circuit 42-1 is programmed to generate the first selecting signal SEL of "11".

When the row address information of the defective normal memory cell ① is input (e.g., PRA11 is logic high), the program circuit 40-1 of FIG. 1 generates the redundant enable signal REN1 having a logic "high" level. The selecting signal generating circuit 42-1 generates a two-bit first selecting signal SEL1 of "11". The OR circuit 46 generates the control signal CON of "11", and the OR circuit 48 generates the redundant enable signal RWEN having a logic "high" level.

The multiplexers 60-1 to 60-4 map the first pre-decoding signals PRA14, PRA11, PRA13, and PRA12 to the first decoding signals PX1 to PX4 in response to the control signal CON of "11".

The AND gate AND7 of FIG. 2 selects the redundant sub word line RWL2 by ANDing the redundant word line enable signal RWEN having a logic "high" level and the first decoding signal PX2 having a logic "high" level. As a result, the sub word line WL11 is replaced with the redundant word line RWL2.

Therefore, defects in a sub word line, which cannot be repaired by the conventional semiconductor memory device of FIG. 1 because of a defect in the associated redundant sub word line, can be repaired by the semiconductor memory device of FIG. 3.

As another example, when defects occur in the normal memory cells ①, ②, ③, and ④, the row address information of the defective normal memory cells ①, ②, ③, and ④ is programmed in the program circuits 40-1 to 40-4, and the fuses of the selecting signal generating circuit 42-4 are blown to generate the first selecting signal that maps address information (i.e., pre-decoding signal), normally associated with the row including a defective memory cell to an available row of redundant memory cells that do not include any defective memory cells.

Because the sub word lines WL23 and WLk3 of the defective normal memory cells ③ and ④ correspond to the same first decoding signal, only one of the sub word lines WL23 of the defective memory cell ③ and the sub word line WLk3 of the defective memory cell ④ can be replaced with the redundant sub word line RWL3 corresponding to that first decoding signal. Therefore, assuming that the sub word line WL23 is replaced by the redundant sub word line RWL3, the sub word line WLk3 has to be replaced by a different, available and non-defective sub word line. Assume the redundant sub word line RWL4 is available and non-defective. Then, the fuses of selecting signal generating circuit 42-4 are blown to generate the selecting signal SEL4 of "11".

When the row address information of the defective normal memory cells ①, ② and ③ is input, the sub word lines WL11, WL22 and WL23 are not selected and the redundant sub word lines RWL1, RWL2 and RWL3 are selected. When the row address information of the defective normal memory ④is input (e.g., PRA13 is logic high), the program circuit 40-4 of FIG. 4 generates the redundant enable signal REN4 having a logic "high" level.

The AND circuit 44-4 generates the fourth selecting signal S4 having a "11" level by ANDing the redundant enable signal REN4 having a logic "high" level and the first selecting signal SEL4 of "11". The OR circuit 46 generates the second selecting signal S4 of "11" as the control signal CON, and the OR circuit 48 generates the redundant word line enable signal RWEN having a logic "high" level. When the control signal CON of "11" is generated, the multiplexers 60-1 to 60-4 of FIG. 7 map the first pre-decoding signals PRA14, PRA11, PRA12, and PRA13 to the first decoding signals PX1 to PX4. The AND gate AND6 of FIG. 2 selects the redundant sub word line RWL4 by ANDing the redundant word line enable signal RWEN having a logic "high" level and the first decoding signal PX4 having a logic "high" level. As a result, when the row address information of the defective normal memory cell ④ is input, the sub word line WLk3 is replaced with the redundant sub word line RWL4.

Therefore, a defect in a sub word line corresponding to the same first decoding signal as another defective sub word line, which cannot be repaired by the conventional semiconductor memory device of FIG. 1, can be repaired by the semiconductor memory device of FIG. 3.

As described above, even in the case that the defective sub word line cannot be replaced with the redundant sub word line corresponding to the same first decoding signal, the semiconductor memory device according to the present invention is capable of replacing the defective sub word line with a redundant sub word line corresponding to a different first decoding signal, thereby increasing a repairing efficiency.

Figure 8:
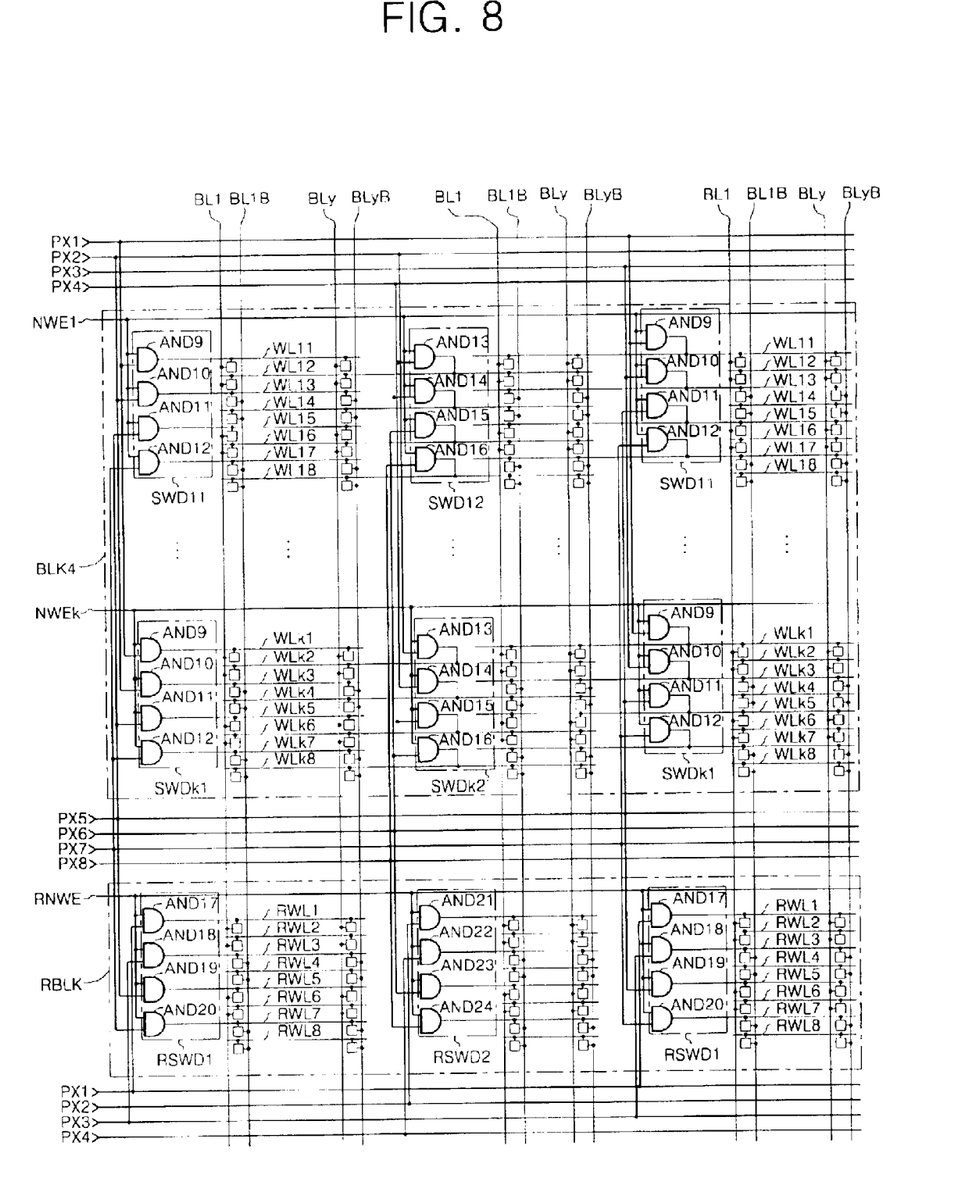
FIG. 8 is a block diagram illustrating one normal memory cell array block and a redundant memory cell array block of the semiconductor memory device of FIG. 3.

FIG. 8 is a block diagram illustrating another embodiment of one normal memory cell array block BLK and a redundant memory cell array block RBLK employed in the semiconductor memory device of FIG. 3. In FIG. 8, the first decoding signals PX1 to PX4 are generated from the first row decoders 12-1, 12-3 and 12-5, and the first decoding signals PX5 to PX8 are generated from the first row decoders 12-2, 12-4 and 12-6. The redundant memory cell array block RBLK includes one redundant word line RNWE.

The normal and redundant memory cell blocks BLK and RBLK are similar to that of FIG. 2, except that the arrays of memory cells in each sub memory cell array block include 8 memory elements instead of 4 and, accordingly, 8 sub word lines instead of 4. The sub word line drivers also differ in their capacity to drive the additional sub word lines as explained in greater detail below.

The sub word line drivers SWDq1, where q=1 to k, each includes AND gates AND9 to AND12. The AND gates AND9 to AND12 AND the first decoding signals PX1, PX3, PX5, and PX7, respectively and a signal transferred to the word line NWE9 to drive the sub word lines WLq1, WLq3, WLq5, and WLq7, respectively.

The sub word line drivers SWDq2 each includes AND gates AND13 to AND16. The AND gates AND13 to AND16 AND the first decoding signals PX2, PX4, PX6, and PX8, respectively, and a signal transferred to the word line NWEq to drive the sub word lines WLq2, WLq4, WLq6, and WLq8, respectively.

The redundant sub word line driver RSWD1 includes AND gates AND17 to AND20. The AND gates AND17 to AND20 AND the first decoding signals PX1, PX3, PX5, and PX7, respectively, and a signal transferred to the redundant word line RNWE to drive the redundant sub word lines RWL1, RWL3, RWL5, and RWL7, respectively. The redundant sub word line driver RSWD2 includes AND gates AND21 to AND24. The AND gates AND21 to AND24 AND the first decoding signals PX2, PX4, PX6, and PX8, respectively, and a signal transferred to the redundant word line RNWE to drive the redundant sub word lines RWL2, RWL4, RWL6 and RWL8, respectively.

Figure 9:
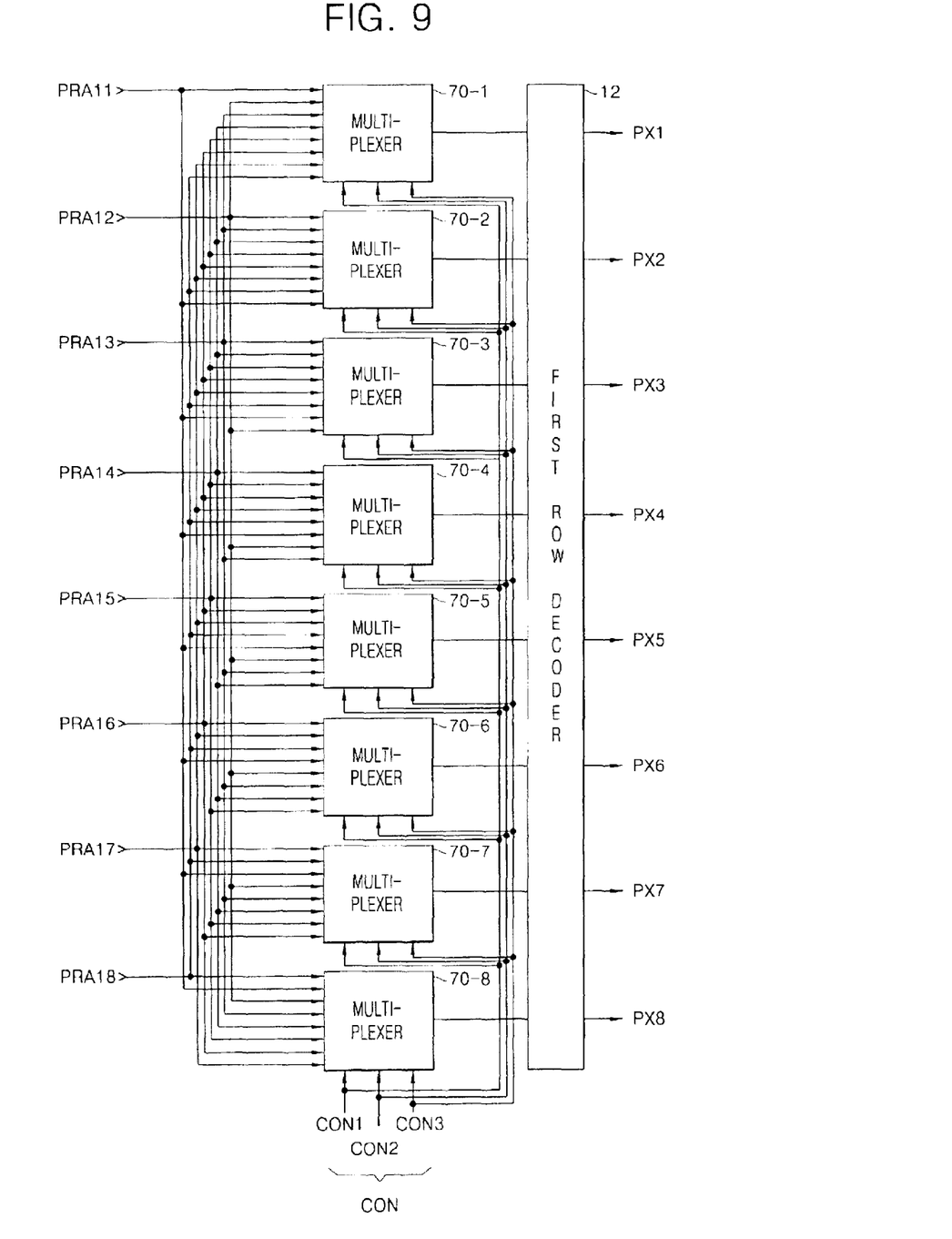
FIG. 9 is a block diagram illustrating one embodiment of a selecting circuit of the semiconductor memory device of FIG. 8.

FIG. 9 is a block diagram illustrating one embodiment of the selecting circuit 32 for use in the semiconductor memory device of FIG. 3 when the circuit of FIG. 8 is employed. For ease of illustration only, the first row decoders have not been logically illustrated as in FIGS. 6 and 7. The selecting circuit of FIG. 9 includes eight multiplexers 70-1 to 70-8. In FIG. 9, signals PRA11 to PRA14 denote the upper first pre-decoding signals, and signals PRA15 to PRA18 denote the lower first predecoding signals. Normally the first pre-decoding signals PRA11 to PRA18 address the sub word lines WLq1 to WLq8, respectively; and therefore, are normally mapped to the first decoding signals PX1 to PX8, respectively.

In the selecting circuit of FIG. 9, the OR circuit 46 of FIG. 4 generates a three bit control signal CON having bits CON1, CON2 and CON3. For the sake of such a configuration, each of the selecting signal generating circuits 42-1 to 42-4 has to include three circuits of FIG. 5.

When the control signal CON is "000", the multiplexers 70-1 to 70-8 generate the first pre-decoding signals PRA11 to PRA14 and PRA15 to PRA18 as the first decoding signals PX1 to PX8. When the control signal CON is "001", the multiplexers 70-1 to 70-8 generate the first pre-decoding signals PRA12 to PRA14, PRA15 to PRA18, and PRA11 as the first decoding signals PX1 to PX8. When the control signal CON is "111", the multiplexers 70-1 to 70-8 generate the first predecoding signals PRA18, PRA11 to PRA14, and PRA15 to PRA17 as the first decoding signals PX1 to PX8. The multiplexers 70-1 to 70-8 change the mapping of the first pre-decoding signals PRA11 to PRA14 and PRA15 to PRA18 in response to the control signals CON1 to CON3 to map the first predecoding signals PRA11 to PRA18 the first decoding signals PX1 to PX8 in eight predetermined different ways.

Figure 10:
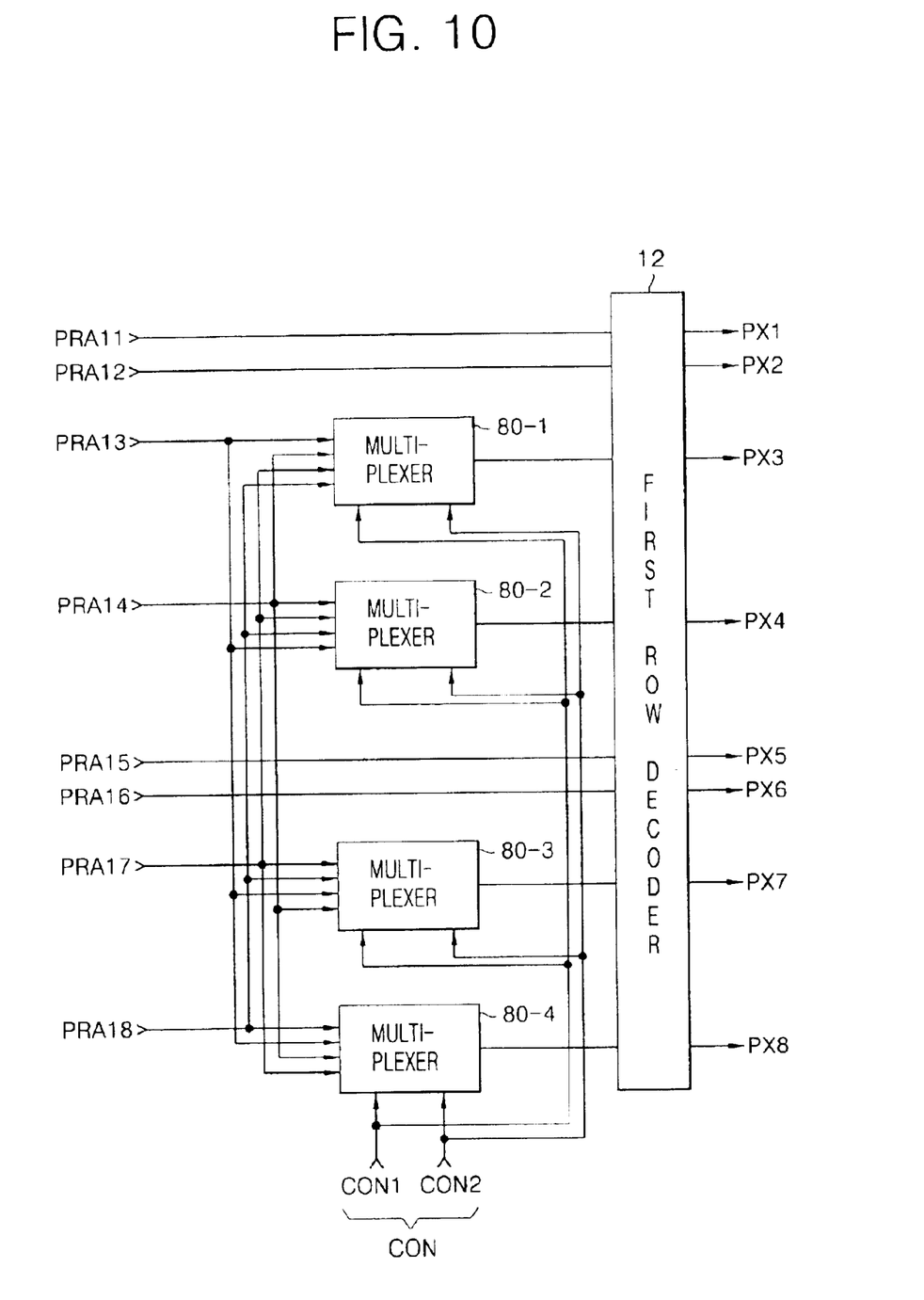
FIG. 10 is a block diagram illustrating another embodiment of the selecting circuit of the semiconductor memory device of FIG. 8.

FIG. 10 is a block diagram illustrating another embodiment of the selecting circuit 32 for use in the semiconductor memory device of FIG. 3 when the circuit of FIG. 8 is employed. For ease of illustration only, the first row decoders have not been logically illustrated as in FIGS. 6 and 7. The selecting circuit of FIG. 10 includes multiplexers 80-1 to 80-4.

In the selecting circuit of FIG. 10, the OR circuit 46 of FIG. 4 generates a two bit control signal CON having bits CON1 and CON2. For the sake of such a configuration, each of the selecting signal generating circuits 42-1 to 42-4 of FIG. 4 has to include two circuits of FIG. 5.

The selecting circuit of FIG. 9 maps the first pre-decoding signals PRA1, PRA12, PRA15, and PRA16 as the first decoding signals PX1, PX2, PX5, and PX6 "as is", and selectively maps the first pre-decoding signals PRA13, PRA14, PRA17, and PRA18 to the first decoding signals PX3, PX4, PX7, and PX8 in four different ways.

When the control signal CON is "00", the multiplexers 80-1 to 80-4 map the first pre-decoding signals PRA13, PRA14, PRA17, and PRA18 to the first decoding signals PX3, PX4, PX7, and PX8. When the control signal CON is "01", the multiplexers 80-1 to 80-4 map the first pre-decoding signals PRA14, PRA17, PRA18, and PRA13 to the first decoding signals PX3, PX4, PX7 and PX8. When the control signal CON is "10" the multiplexers 80-1 to 80-4 map the first pre-decoding signals PRA17, PRA18, PRA13 and PRA14 to the first decoding signals PX3, PX4, PX7 and PX8. When the control signal CON is "11", the multiplexers 80-1 to 80-4 map the first pre-decoding signals PRA18, PRA13, PRA14, and PRA17 to the first decoding signals PX3, PX4, PX7, and PX8.

In other words, the selecting circuit of FIG. 10 is configured to selectively map some of the first pre-decoding signals through the multiplexers and to directly map the other first pre-decoding signals "as is" without passing through the multiplexers.

The present invention is described focusing on the semiconductor memory device having sub word lines but can be applied to a semiconductor memory device having no sub word line configuration.

Figure 11:
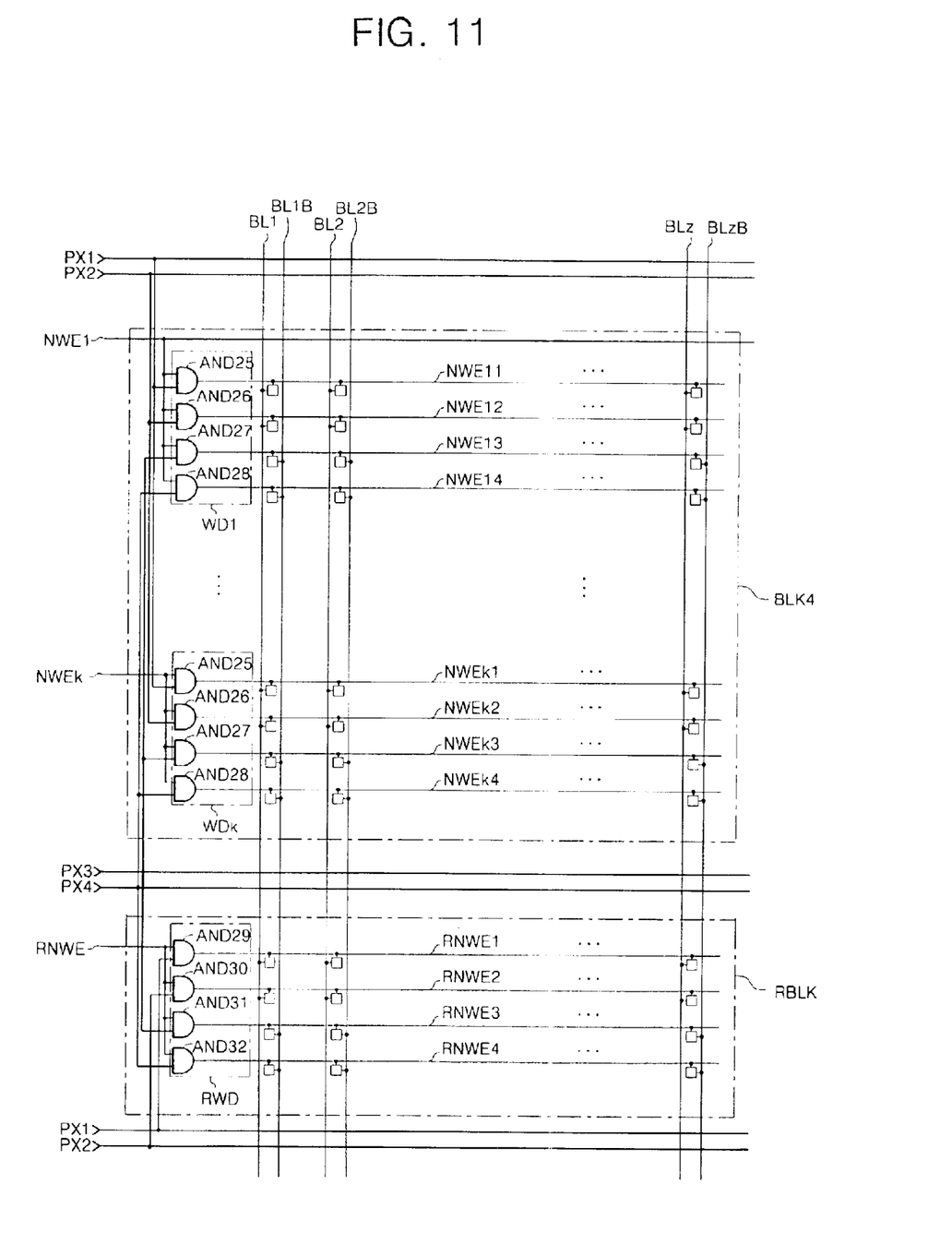
FIG. 11 is a block diagram illustrating another embodiment of the memory cell array block and the redundant memory cell array block of the semiconductor memory device of FIG. 3.

FIG. 11 is a block diagram illustrating another embodiment of the memory cell array block and the redundant memory cell array block of the semiconductor memory device of FIG. 3. The memory cell array block BLK and the redundant memory cell array block RBLK have no sub word line configuration.

Each of word line drivers WD1 to WDk includes AND gates AND25 to AND28. The AND gates AND25 to AND28 drive word lines NWE11 to NWE14, . . . , NWEk1 to NWEk4 by ANDing signals transferred to the word lines NWE1 to NWEk and the first decoding signals PX1 to PX4, respectively.

A redundant word line driver RWD includes AND gates AND29 to AND32. The AND gates AND29 to AND32 drive redundant word lines RNWE1 to RNWE4 by ANDing a signal transferred to the redundant word line RNWE and the first decoding signals PX1 to PX4, respectively.

The memory cell array block BLK4 includes normal memory cells connected, respectively, between the word lines NWE11 to NWE14, . . . , NWEk1 to NWEk4 and the bit line pairs BL1 and BL1 B to BLz and BLzB.

The redundant memory cell array block RBLK includes redundant memory cells connected, respectively, between the redundant word lines RNWE1 to RNWE4 and the bit line pairs BL1 and BL1 B to BLz and BLzB.

In the case that the memory cell array blocks of the semiconductor memory device of FIG. 3 have a configuration of the memory cell array blocks of FIG. 11, and the program and selecting signal generating unit and the selecting circuit have configurations of FIGS. 4, 5 and 7, the defective word line can be replaced with the redundant word line corresponding to a different first decoding signal from the defective word line as described above with respect to the semiconductor memory device of FIG. 3 employing the memory cell array blocks of FIG. 2.

As described herein before, since the defective sub word line (or word line) can be replaced with the redundant sub word line (or redundant word line) corresponding to different decoding signals from the defective sub word line (or word line), the semiconductor memory device according to the present invention can achieve an excellent repair efficiency.

While the invention has been particularly shown and described with reference to preferred embodiments thereof, it will be understood by those skilled in the art that the foregoing and other changes in form and details may be made therein without departing from the spirit and scope of the invention.

I claim:

1. A semiconductor memory device, comprising:
a selecting circuit selectively mapping address information to address decoders that address rows of normal and redundant memory cells; and wherein
the selecting circuit selectively reorders a parallel arrangement of the address information to map the address information to address decoders that address rows of normal and redundant memory cells.

2. The semiconductor memory device of claim 1, wherein the address information includes row address information.

3. The semiconductor memory device of claim 1, wherein the control circuit controls the selecting circuit such that the address information for one of two rows of normal memory cells, both rows including at least one defective memory cell and being associated with a same redundant row of memory cells for replacement purposes, is mapped to at least one address decoder of a row of redundant memory cells not associated therewith.

4. The semiconductor memory device of claim 3, wherein the control circuit controls the selecting circuit such that the address information for the row of normal memory cells, which includes a defective normal memory cell and is associated with a row of redundant memory cells for replacement purposes that also includes a defective redundant memory cell, is mapped to at least one address decoder of a row of redundant memory cells not associated therewith.

5. The semiconductor memory device of claim 1, wherein the control circuit controls the selecting circuit such that the address information for a row of normal memory cells, which includes a defective normal memory cell and is associated with a row of redundant memory cells for replacement purposes that also includes a defective redundant memory cell, is mapped to at least one address decoder of a row of redundant memory cells not associated therewith.

6. The semiconductor memory device of claim 1, wherein the control circuit generates a redundant enable signal to enable replacement of a row of normal memory cells with a row of redundant memory cells.

7. The semiconductor memory device of claim 6, further comprising:
  sub word line drivers each selectively driving at least one row of normal memory cells based on the address information and the redundant enable signal; and
  at least one redundant sub word line driver selectively driving at least one row of redundant memory cells based on the address information and the redundant enable signal.

8. The semiconductor memory device of claim 1, wherein the selecting circuit maps a portion of the address information in a predetermined manner, and selectively maps a remaining portion of the address information.

9. The semiconductor memory device of claim 1, wherein the selecting circuit selects a mapping permutation from among a number of mapping permutations, and the number of mapping permutations being less than a number of possible mapping permutations.

10. The semiconductor memory device of claim 1, further comprising:
  an address generating circuit generating the address information.

11. The semiconductor memory device of claim 1, further comprising:
  a first address generating circuit generating first address information;
  a second address generating circuit generating second address information; wherein
  the selecting circuit selectively maps the first address information; and
  the control circuit controls the selecting circuit based on the first and second address information.

12. The semiconductor memory device of claim 1, wherein the control circuit comprises:
  a programming circuit configuration generating redundant enable signals to enable replacement of a row of normal memory cells with a row of defective memory cells; and
  a selecting control signal generating circuit configuration programmed to generate selecting signals for controlling operation of the selecting circuit.

13. The semiconductor memory device of claim 1, wherein the rows of normal and redundant memory cells are connected to one of a word line and a sub word line.

14. The semiconductor memory device of claim 1, wherein the control circuit comprises:
  a defective address program means programming defective row addresses of a plurality of normal memory cells, and enabling a corresponding redundant word line enable signal among a plurality of redundant word line enable signals if an inputted row address is equal to at least one of the programmed defective row addresses;
  a redundant word line driving means driving a plurality of redundant word lines by combining the plurality of redundant word line enable signals and the address information of the inputted row address; and
  a selecting signal generating means programming selecting signals corresponding to the redundant word line enable signals, and generating the selecting signals corresponding to the redundant word line enable signals to control the selecting circuit.

15. The semiconductor memory device of claim 14, wherein the selecting signal generating means comprises:
  a PMOS transistor having a source connected to a power supply voltage and a gate to which a power up signal is applied;
  a fuse connected between a drain of the PMOS transistor and a first signal generating node;
  a first NMOS transistor having a drain connected to the first signal generating node, a gate to which the power up signal is applied and a source to which a ground voltage is applied;
  a second NMOS transistor having a drain connected to the first signal generating node, a gate to which a second signal generating node is applied and a source to which a ground voltage is applied; and
  a NOR gate NORing the power up signal and a signal of the first signal generating node to transfer the NORed signal to the second signal generating node.

16. The semiconductor memory device of claim 15, wherein the power up signal is a signal which increases according to the power supply voltage changes and transits to a low level when the power supply voltage reaches to a predetermined level.

17. The semiconductor memory device of claim 14, wherein the selecting circuit comprises a number of multiplexers controlling and outputting an order of bits of the address information in response to the selecting signals.

18. A method of addressing a semiconductor integrated circuit, comprising:
  selectively mapping address information to address decoders that address rows of normal and redundant memory cells; and wherein
  the selecting step selectively recorders a parallel arrangement of the address information to map the address information.

19. The method of claim 18, further comprising:
  controlling the selecting step such that the address information for one of two rows of normal memory cells, both rows including at least one defective memory cell and being associated with a same redundant row of memory cells for replacement purposes, is mapped to an address decoder of a row of redundant memory cells not associated therewith.

20. The method of claim 19, further comprising:
controlling the selecting step such that the address information for the row of normal memory cells, which includes a defective normal memory cell and is associated with a row of redundant memory cells for replacement purposes that also includes a defective redundant memory cell, is mapped to and address decoder of a row of redundant memory cells not associated therewith.

21. The method of claim 18, further comprising:
controlling the selecting step such that the address information for a row of normal memory cells, which includes a defective normal memory cell and is associated with a row of redundant memory cells for replacement purposes that also includes a defective redundant memory cell, is mapped to an address decoder of a row of redundant memory cells not associated therewith.

22. The method of claim 18, further comprising:
programming addresses of defective memory cells among a plurality of memory cells and programming selecting signals;
generating a corresponding redundant enable signal among a plurality of redundant enable signals and corresponding selecting signals of an inputted row address is equal to at least one of the programmed defective addresses;
generating a plurality of redundant enable signals by combining the plurality of redundant enable signals and address information of the inputted row address; and wherein the selecting step selectively maps the address information in response to the selection signals.

23. A semiconductor memory device, comprising:

a selecting circuit selectively mapping address information to address decoders that address rows of normal and redundant memory cells; and a control circuit controlling the selecting circuit; wherein the selecting circuit selects a mapping permutation from among a number of mapping permutations, and the number of mapping permutations being less than a number of possible mapping permutations.

24. A semiconductor memory device, comprising:

a selecting circuit selectively mapping address information to address decoders that address rows of normal and redundant memory cells; and a control circuit controlling the selecting circuit, wherein the control circuit includes, a programming circuit configuration generating redundant enable signals to enable replacement of a row of normal memory cells with a row of defective memory cells; and a selecting control signal generating circuit configuration programmed to generate selecting signals for controlling operation of the selecting circuit.

* * * * *